(12) United States Patent
Bast et al.

(10) Patent No.: US 7,215,010 B2
(45) Date of Patent: May 8, 2007

(54) DEVICE FOR PACKING ELECTRONIC COMPONENTS USING INJECTION MOLDING TECHNOLOGY

(75) Inventors: Ulrich Bast, München (DE); Georg Ernst, Thalmassing (DE); Thomas Zeiler, Regensburg (DE); Matthias Oechsner, Mülheim A.D. Ruhr (DE)

(73) Assignee: Infineon Technologies AG, Munich (DE)

( * ) Notice: Subject to any disclaimer, the term of this patent is extended or adjusted under 35 U.S.C. 154(b) by 475 days.

(21) Appl. No.: 10/220,752

(22) PCT Filed: Mar. 2, 2001

(86) PCT No.: PCT/DE01/00778

§ 371 (c)(1),
(2), (4) Date: Dec. 9, 2002

(87) PCT Pub. No.: WO01/65601

PCT Pub. Date: Sep. 7, 2001

(65) Prior Publication Data

US 2003/0178747 A1    Sep. 25, 2003

(30) Foreign Application Priority Data

Mar. 3, 2000    (DE) ............................... 100 10 461

(51) Int. Cl.
*H01L 23/495* (2006.01)
*H01L 23/053* (2006.01)
*H01L 23/28* (2006.01)

(52) U.S. Cl. ...................... 257/668; 257/676; 257/700; 257/787; 257/E23.037; 257/E23.069

(58) Field of Classification Search ........ 257/668–669, 257/676, 677, 700, 725, 787, 706, E23.037, 257/E23.069
See application file for complete search history.

(56) References Cited

U.S. PATENT DOCUMENTS

| 4,985,097 | A | * | 1/1991 | Matsumura et al. | ........... 156/87 |
| 5,024,883 | A | * | 6/1991 | SinghDeo et al. | .......... 428/323 |
| 5,071,793 | A | * | 12/1991 | Jean et al. | ..................... 501/16 |
| 5,270,262 | A | | 12/1993 | Switky et al. | |
| 5,698,896 | A | * | 12/1997 | Komatsu et al. | ............ 257/705 |
| 5,753,972 | A | * | 5/1998 | Wein et al. | ................. 257/691 |
| 5,798,070 | A | | 8/1998 | Sakai et al. | |

(Continued)

FOREIGN PATENT DOCUMENTS

EP    0 971 401 A2    1/2000

(Continued)

*Primary Examiner*—Michael Lebentritt
*Assistant Examiner*—Ron Pompey
(74) *Attorney, Agent, or Firm*—Laurence A. Greensberg; Werner H. Stemer; Ralph E. Locher (57) ABSTRACT

A device for and method of packaging electronic components (1) using injection-molding. For this purpose, a multiplicity of components (1) are arranged in predetermined positions on a first side (2) of a leadframe (3). The leadframe (3) has interconnects (5) with contact terminal areas (6) for connecting to contact areas (7) of the electronic components (1) and contact vias (8) to external contacts on a second side (10) of the leadframe (3). In this case, the leadframe (3) includes a ceramic substrate (11) with a first side (2) having edge regions (12) configured with a ductile, annular metal layer (13).

38 Claims, 3 Drawing Sheets

U.S. PATENT DOCUMENTS 5,918,112 A * 6/1999 Shah et al. .................. 438/107

FOREIGN PATENT DOCUMENTS

| JP | 56038830 | | * | 9/1979 |
| --- | --- | --- | --- | --- |
| JP | 01278755 | A | * | 5/1988 |
| JP | 01 121 656 | A | | 5/1989 |
| JP | 01278755 | A | * | 11/1989 |
| JP | 08 124 955 | A | | 5/1996 |
| JP | 08 236 560 | A | | 9/1996 |
| JP | 09 219 470 | A | | 8/1997 |
| JP | 11-147956 | | | 6/1999 |
| JP | 11-251149 | | | 9/1999 |
| JP | 2001 148392 | | | 5/2001 |

* cited by examiner

DEVICE FOR PACKING ELECTRONIC COMPONENTS USING INJECTION MOLDING TECHNOLOGY

BACKGROUND OF THE INVENTION

Field of the Invention

The invention relates to a device for packaging electronic components using injection molding and to a method of packaging electronic components using this device.

Devices of this type for packaging electronic components are used in the CSP (Chip Size Packaging) technique to encapsulate a multiplicity of electronic components on a first side of a leadframe in a plastic molding compound. For this purpose, the multiplicity of components are arranged in predetermined positions on a first side of a leadframe, and the leadframe has interconnects, contact terminal areas for connecting to microscopic contact areas of the electronic components and contact vias, which are connected to interconnects on a second side of the leadframe. External contact terminal areas or contact bumps are provided at predetermined points on this second side. In this case, the second side is arranged opposite from the first side of the leadframe.

In the case of devices of this type for what are known as BGA (Ball Grid Array) components, the leadframe comprises a glass-fiber-reinforced epoxy substrate if these components are designed for high-frequency or logic applications. To protect the electronic components, which are usually arranged in semiconductor chips on the first side of the leadframe, from damage, the entire device is sealed in plastic using an injection-molding process. This injection-molding process is standardized as a "transfer molding process". The leadframe must in this case withstand high loads, since an injection mold and the leadframe of the device are clamped together to seal the joint between the injection mold and the leadframe. In this case, a high pressing pressure acts on the edges of the leadframe, so that no plastic molding compound escapes between the leadframe and the injection mold.

This standard process cannot be used when a ceramic substrate is provided as the leadframe because of the great risk of rupturing the ceramic due to the high loads required in the injection-molding process between the injection mold and the leadframe. However, the previously used leadframes comprising a glass-fiber-reinforced epoxy substrate, for example, have the disadvantage that, at the melting temperatures of the production and further-processing steps, such as soldering operations, there is the risk that moisture bubbles in the glass-fiber-reinforced epoxy resin substrate will burst and consequently damage the electronic component.

It is known from U.S. Pat. No. 5,270,262 to provide the leadframe with integrated sealing elements, in particular O-rings, which have to be removed again after encapsulation in plastic molding compound. Such a method does not appear to be cost-effective, since it requires additional method steps over and above those of the standard process.

SUMMARY OF THE INVENTION

It is an object of the invention to provide a device which overcomes the disadvantages in the prior art and makes it possible to package electronic components mounted on ceramic leadframes by a highly automated injection-molding process. Furthermore, it is an object of the invention to provide a method of packaging electronic components using a corresponding device.

For this purpose, the leadframe is a ceramic substrate which has a ductile, annularly arranged metal layer arranged in the edge regions of the first side. The electronic components are also arranged on the first side. This ductile metal layer enables an injection mold to work itself into the edge regions of the ceramic substrate and seal the edge regions, compensating for unevennesses of the ceramic substrate. Furthermore, after the injection-molding, the edge region with the ductile metal layer can be readily sawn off in an advantageous way when individually separating the device for packaging electronic components.

In the highly automated standard process of transfer molding, the plastic molding compound is injected at a high temperature of about 180° C. and at high pressure of about 8 MPa into a cavity placed onto the leadframe of the device. For this purpose, the injection mold with the cavity forming a plastic package must be placed with great force onto the leadframe, to compensate for bending deflections and corrugations of the leadframe, which would lead to the plastic molding compound leaking or escaping from the cavity. On account of the ductile metal layer, the high stresses occurring in this case can no longer lead to rupturing of the typically brittle ceramic, since the ductile metal is plastically deformed and reduces the stresses. At the same time, the popcorn effect is avoided by using a ceramic substrate. Although ceramic substrate materials have great hardness and rigidity, a high level of wear of the injection molds is avoided by the ductile metal layer, which reduces the cost of the highly automated standard process.

For these reasons it is possible to dispense with the the metal caps used with ceramic substrates to protect the electronic components or to dispense with liquid epoxy-resin compounds in a casting mold, which are used individually for each component or for groups of components, and to produce plastic-encapsulated CSP and MCP (Multichip Package) components with ceramic substrates cost-effectively.

With the inventive device, it is consequently possible to produce CSP or MCP components with ceramic substrates without losing any of the ceramic substrates through rupture. Consequently, the restrictions of the highly automated standard process typical of the material are at the same time overcome, so that components, advantageously with ceramic substrates, can be reliably and cost-effectively coated with a plastic molding compound by the transfer molding process.

In addition, the device provides the advantage that higher structure densities can be achieved with the leadframe of a ceramic substrate by narrower interconnects, smaller bonding pads and improved electrical configurations. Additionally, the "popcorn effect" is completely avoided, and no damage is caused by the evaporation of adsorbed water molecules in porous plastic substrates, for example, during the later attachment of external contact terminal areas or the soldering in of contact bumps. In addition, the ceramic substrate has the advantage of improved heat dissipation through the substrate for the electronic components, so that additional cooling devices need not be used. Finally, the ceramic substrate provides the possibility of realizing multilayer components with integrated passive structures such as resistors, inductances, and capacitors in the ceramic substrate between correspondingly prepared layers of ceramic.

In one embodiment of the invention, the annularly arranged metal layer forms a closed metal ring. The advantage of this closed metal ring lies in the reliability with which an annular seal can be achieved between the ceramic substrate and the injection mold during the injection of the plastic molding compound.

In a further embodiment of the invention, the annularly arranged metal layer has interruptions. These interruptions are made so narrow that, when the plastic compound is injected, it solidifies within the interruptions. This has the advantage that a more favorable distribution of the stresses produced by the different expansion of the substrate and the metal layer can be achieved. The interruptions can be arranged in such a way that the annularly arranged metal layer comprises a multiplicity of metal strips which are arranged directly in a row and aligned transversely in relation to the annular arrangement.

In another embodiment of the invention, the contact bumps protruding from the second side of the ceramic substrate are produced from solder balls. These solder balls are placed in prepared positions on the second side of the ceramic substrate only after the injection-molding of the electronic components.

In the case of a further embodiment of the invention, the ceramic substrate is a multi-layered substrate, the layers of which have different coefficients of thermal expansion. A central inner ceramic layer has a higher coefficient of thermal expansion than the neighboring outer layers. Consequently, a higher resistance of the substrate to the loads occurring in the highly automated injection-molding process is advantageously achieved. This is because the tensile stresses effectively acting at the surface in the injection-molding process are reduced.

Since, in the case of this embodiment, the coefficient of expansion of the outer layers is lower than that of the central inner layer, compressive stresses are produced in the outer layers and tensile stresses are produced in the inner region during cooling down from the sintering temperature, at which a virtually stress-free state prevails. The compressive stresses in the outer layers consequently reduce the loading of the surface by the tensile stresses acting during the injection-molding process.

In a further embodiment of the invention, the ceramic substrate is a multi-layered substrate, the layers of which have different moduli of elasticity. A central inner ceramic layer has a higher modulus of elasticity than the neighboring outer layers. Because of the locally higher compliance of the ceramic in the region near the surface, where the highest deformations occur when the injection mold is placed thereon, the stresses occurring there are reduced. Cracks which possibly form in spite of the lower stresses and spread from the surface toward the middle are stopped at the transition to the inner central layer. The strength and rigidity of the assembly required for the further processing steps are advantageously ensured by the inner central layer, which has high strength and a high modulus of elasticity.

In a further embodiment of the invention, the ceramic substrate is a multi-layered substrate, which has ceramic layers and metal layers for reducing internal stresses. As a result, the rigidity of the overall system is advantageously reduced and consequently the risk of rupturing the ceramic substrate is reduced.

In a further embodiment of the invention, the ceramic substrate is a multi-layered substrate which has ceramic layers and metal layers structured into interconnects and passive elements, and contact vias that selectively connect the metal paths and the components at the different metal layer levels to one another. With a ceramic substrate of this type, multi-layer components can be advantageously realized. Passive structures, such as resistors, inductive structures and capacitors, are already produced in the individual metal layers during the sintering of the ceramic substrate.

The inventive ductile annularly arranged metal layer is arranged in the placement region of an injection mold defining the package form, so that, in an advantageous way, the injection mold does not directly touch the hard ceramic substrate and consequently the injection mold wears less than in the case of conventional ceramic substrates, since it is not in contact with the ceramic substrate, but only with the ductile metal layer. The injection mold therefore has a longer service life.

A ductile metal layer, which is intended at the same time also to have a sealing effect, must be dimensioned with adequate thickness. However, this entails the risk of distorting the ceramic substrate when the metal layer is applied. To compensate for a disadvantageous effect of this type, the edge regions of the second side of the ceramic substrate is additionally provided with a ductile annularly arranged closed metal layer. What is more, to provide a predetermined breaking point in uncritical edge regions of the ceramic substrate for when the ceramic is overloaded, the edge regions of the second side of the ceramic substrate may additionally have an annularly arranged groove. This groove lies within the placement region of the injection mold and consequently advantageously reduces the stresses in the inner region of the active electronic semiconductor structures. Although the local stresses in the region of the groove itself increase as a result, the groove ensures that load cracks in the ceramic occur only in the edge region and not in the usable area for the electronic components.

A fine-grained $Al_2O_3$ with a purity of $\geq 96\%$ is used as the material for the ceramic substrate. This aluminum oxide is the ceramic substrate material best suited for the inventive device for packaging electronic components because of the combination of good electrical and mechanical properties and also its relatively low price and its availability. In the standard dimensions, as also used for the thin-film technique, $Al_2O_3$ is available at a relatively low price. Although the modulus of elasticity of $Al_2O_3$ is relatively high, whereby high stresses are induced in the ceramic substrate during the injection-molding, this can be accepted because of the high strength of the material. In addition, as mentioned above, stress peaks can be further reduced by providing a corresponding multi-layer formation of the substrate, and in particular, by preferably providing the groove on the second side of the ceramic substrate.

The fine-grained character of the ceramic can be improved by additions of MgO to the $Al_2O_3$, since magnesium oxide acts as a grain growth inhibitor in $Al_2O_3$ ceramics and consequently excessively large grains and excessive inhomogeneities in the ceramic substrate caused by abnormal grain growth are avoided. By adding incorporated $ZrO_2$ particles, the known mechanism typical of partly stabilized $ZrO_2$ ceramics can also be transferred to aluminum oxide ceramics. In this case, the microstructure of the $ZrO_2$ particles is set by suitable process engineering measures in such a way that they assume not only a monoclinic phase, but also at room temperature, a metastable tetragonal phase. This tetragonal phase of the $ZrO_2$ is only martensitically transformed into the stable monoclinic phase under the influence of stress fields in the vicinity of a crack tip. This entails an increase in volume, which generates compressive stress, which locally hinders the tensile stress field responsible for crack propagation and consequently prevents crack propagation in an aluminum oxide ceramic with incorporated $ZrO_2$ particles.

In a further embodiment of the invention, the ceramic substrate is produced from fine-grained steatite and/or forsterite. On account of the molecular structure of steatites and forsterites, the thermal connectivity is indeed lower than in the case of aluminum oxide, but at the same time the modulus of elasticity is also low, so that these materials appear to be entirely suitable for the injection-molding of packages by the highly automated process.

Fine-grained aluminum nitride may also be used as the ceramic substrate, especially since aluminum nitride reaches a high thermal conductivity and the mechanical properties are comparable with those of aluminum oxide. What is more, the low coefficient of thermal expansion, which for aluminum nitride is nearer to that of the semiconductor silicon, may be an additional advantage for some applications. However, for injection-molding it would be more advantageous if the coefficient of thermal expansion of the ceramic substrate were of the order of magnitude of the plastic injection-molding compound, in order to keep instances of bowing and warpage of the ceramic substrate small.

This can be achieved by using glass ceramic materials as the ceramic substrate. Glass ceramic materials of this type contain not only a ceramic fraction, for example of aluminum oxide, but also a glass fraction. In this case, the glass fraction is greater in the case of low-temperature glass ceramic materials than in the case of high-temperature glass ceramic materials. Because of the greater glass content, low-temperature glass ceramic materials of this type can be sintered at correspondingly lower temperatures between 850 and 1000° C.

However, these material systems based on glass ceramic materials offer the advantage that the substrate properties can be tailored to the device for packaging electronic components by obtaining the optimized composition from the mixing ratio of the glass and ceramic components. For example, the coefficient of expansion of the glass ceramic may be adapted to the coefficient of expansion of the plastic molding compound, whereby a high resistance to cyclical temperature changes can be achieved in comparison with pure $Al_2O_3$ ceramics.

A method of packaging electronic components using the device described above is characterized by the following method steps:

providing a ceramic substrate with interconnects, contact terminal areas and contact vias for providing contact bumps at predetermined positions, the ceramic substrate having a ductile metal layer in its edge regions and carrying electronic components within the ductile metal layer;

providing an injection mold forming the package form;

pressing the injection mold in a sealing manner onto the ductile annular metal layer arranged in the edge region of the ceramic substrate;

injecting a plastic molding compound into the cavity between the injection mold and a first side, which carries components, of the ceramic substrate;

applying contact bumps at predetermined positions of a second side of the ceramic substrate; and individually separating the electronic components with the molded-on package.

This method has the advantage that electronic components on ceramic substrates can now be encapsulated in an injection-molding compound using a highly automated standard process, that is to say transfer molding, as it is known. In contrast with the previous technique, in which only glass-fiber-reinforced epoxy or polyimide substrate materials were used on account of the high temperature and compressive loading of the substrates, this now makes it possible on the basis of the inventive structuring of the ceramic substrate, in particular with a ductile metal layer in the edge regions of the substrate, for an injection mold to be placed in a sealing manner onto ceramic substrates and for this seal between the ductile metal layer and the injection mold to withstand the high pressure of about 8 MPa.

With the ceramic substrate, higher structure densities can be realized in comparison with the epoxy or polyimide substrate materials, by virtue of the fact that narrower interconnects and smaller plated-through holes can be used. What is more, the "popcorn effect", which is known for plastic substrates and which has an effect in particular when soldering on the solder balls to form contact bumps on the ready-encapsulated component, is overcome by this method, since ceramic substrates, by contrast with the conventional plastic substrates, are sintered at correspondingly high temperatures and consequently no longer contain absorbed moisture. A further advantage of this method is that the wear of the injection mold is kept low by the ductile metal layer, since the mold does not undergo any wearing contact with the hard ceramic substrate surface.

Since it is also the case with the conventional methods that the edge regions of a plastic leadframe are cut off during the individual separation of the electronic components, the inventive method includes cutting off the edge region having the applied ductile metal coating at the end of the process during the individual separation of the electronic components.

In the case of a further way of carrying out the method, multi-layered substrates, the layers of which have different coefficients of thermal expansion in such a way that at least one central inner ceramic layer has a higher coefficient of thermal expansion than the neighboring outer layers, may be used as ceramic substrates. The use of multi-layered substrates with different coefficients of expansion has the advantage that the risk of rupturing the ceramic substrate when the high process pressures are applied during the injection-molding process is avoided, since compressive stresses are induced in the neighboring outer layers during the cooling down of the ceramic substrates after the sintering. In this manner, the risk of crack formation under tensile stresses during the injecting operation and the further subsequent thermal treatments is reduced.

In the case of a further way of carrying out the method, a multi-layered substrate, the layers of which have different moduli of elasticity in which a central inner ceramic layer has a higher modulus of elasticity than the neighboring outer layers, is used as the ceramic substrate. This layer sequence in the ceramic substrate has the advantages already discussed above and reduces the risk of rupturing the ceramic substrate during the injecting operation.

A similar effect can be achieved by incorporating structured metal layers during the building up of the ceramic substrate, so that the metal layers contribute to reducing internal stresses.

In the method, it is also possible to use ceramic substrates which are multi-layered and in which there are present in the substrate not only ceramic layers, but also structured metal layers, which assume the functions of interconnects and functions of passive components. For connecting to the outer metal layers of the substrate, contact vias are selectively provided for this purpose through the different ceramic layers in this multi-layered ceramic substrate, and glass ceramics are used as the ceramic substrate or as ceramic layers.

For applying a ductile metal layer, a plating technique is used, in which the ductile material is applied in strip form. Other preferred metal coating processes are the screen printing process and the stencil printing process, which have the advantage that a high number of ceramic substrates can be covered with metal layers at the edge in an automated process.

If a ductile copper alloy is used for the ductile annularly arranged metal layer, direct copper bonding can be used (DCB process), which can be employed in particular for aluminum oxide substrates.

In a further way of carrying out the method, a ductile aluminum alloy is used as the ductile annularly closed metal layer, which has the advantage that particularly soft metal layers can be realized with it. Iron/nickel alloys may also be used as the ductile annularly closed metal layer, these having in particular the advantage that no metal residues accumulate on the injection mold, as could possibly occur in the case of very soft aluminum alloys.

A further method variant for applying the ductile metal layer is active soldering, in which a covering with a filler which reacts with the ceramic is soldered on.

A further example of how the inventive method is carried out consists in that an additional ductile annularly arranged metal layer is applied to the edge regions of the the second side of the ceramic substrate. With this method step, possible distortion of the first side is compensated in an advantageous way by the ductile annularly arranged metal layer provided there. In addition, an annularly closed groove may be machined into the edge regions of the ceramic substrate on the second side. With this method step it is ensured that the edge region is produced with a predetermined breaking point, which prevents cracks from progressing from the edge region into the central, middle region of a ceramic substrate.

Materials for the ceramic substrate have already been discussed at length above, and the associated advantages can also be transferred to the corresponding method steps, so that they are not discussed any further here.

Embodiments of the invention are now explained in more detail on the basis of the accompanying drawings.

DESCRIPTION OF THE PREFERRED EMBODIMENTS

Figure 1A:
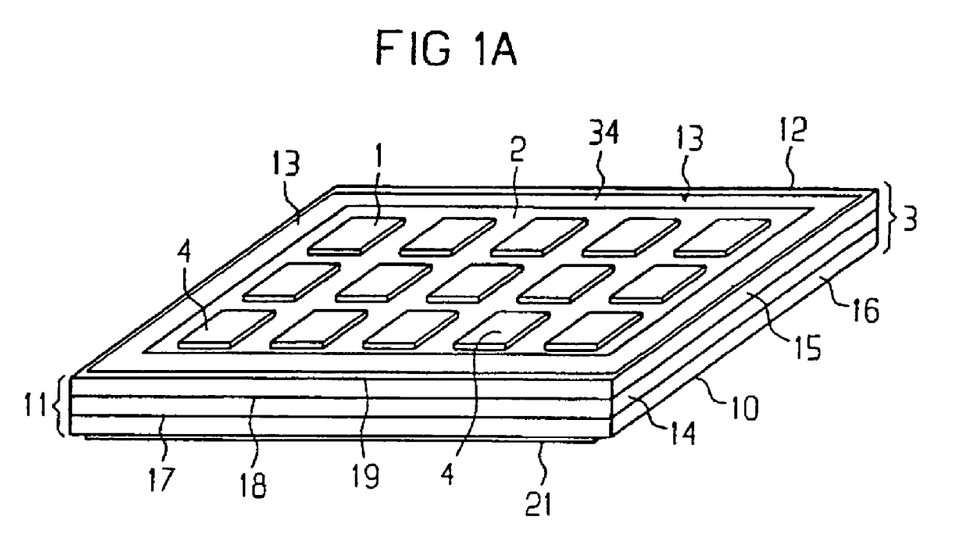
FIGS. 1A and 1B show perspective views of embodiments of devices for packaging electronic components using the injection-molding technique.

FIG. 1a shows a perspective view of a device for packaging electronic components 1 using the injection-molding technique corresponding to an embodiment of the invention. For this purpose, a multiplicity of components 1 are arranged in predetermined positions 4 on a first side 2 of a ceramic substrate 11. The ceramic substrate 11 has the interconnects 5, contact areas 6, and contact vias 8 shown in FIG. 4. This embodiment of the invention includes a ductile annularly arranged metal layer 13 arranged in the edge regions 12 of the ceramic substrate 11 on the first side 2 and an additional ductile annularly arranged metal layer 21 arranged on the second side 10, which lies opposite from the first side 2. These annularly arranged metal layers 13 and 21 are formed in the embodiment of FIG. 1a as a closed metal ring 34. By this symmetrical construction of the ductile metal layers 13, 21, stressing and bowing is advantageously avoided when the ductile metal layers 13, 21 of the ceramic substrate 11 are applied.

Figure 4:
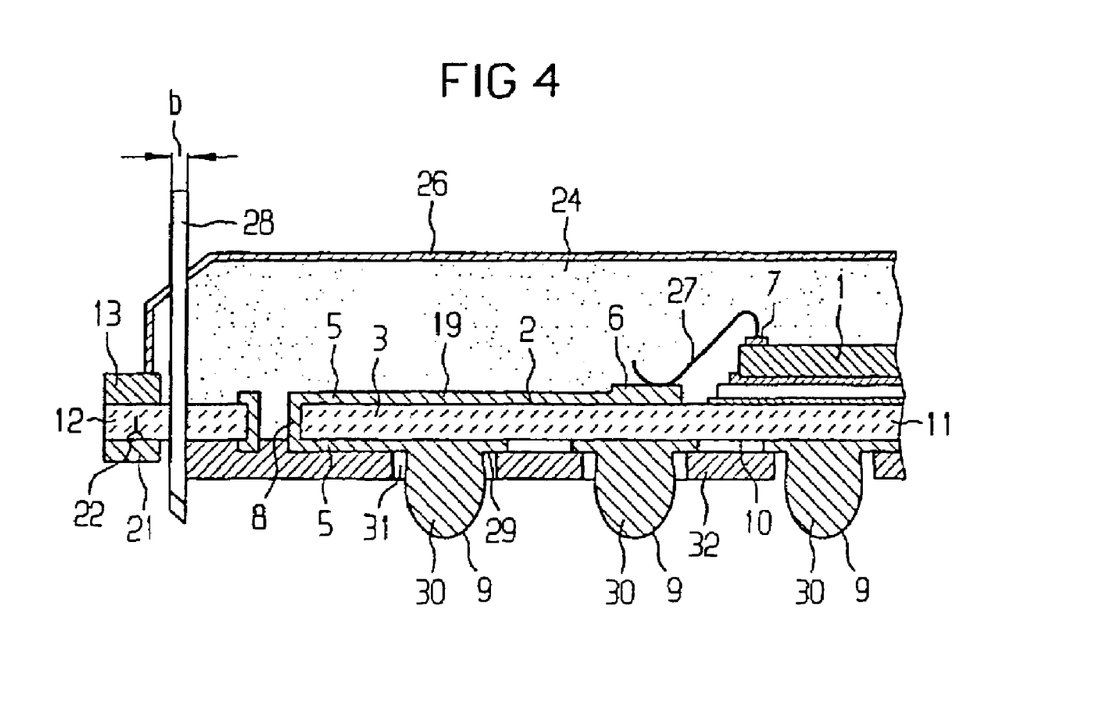
FIG. 4 shows an edge region being cut off after the packaging of the electronic components and the fusing on of solder balls to form contact bumps in predetermined positions on a ceramic substrate.

As shown in FIG. 1a, the ceramic substrate 11 may be constructed from a number of ceramic layers 14, 15 and 16, it being possible for structured metal layers 17 and 18 to be arranged in between. The different metal layer levels 17, 18 and 19 may be structured to form interconnects and passive components and can be connected to one another by contact vias 8, as a shown in FIG. 4. As can be seen in FIG. 4, the electronic components have contact areas 7, which are connected to the interconnect level 19 via contact terminal areas on the ceramic substrate 11. This connection may either be produced by flip-chip technology, or as shown in FIG. 4, can be realized using a bonding wire connection 27. Each of the electronic components 1, which in this embodiment comprise semiconductor chips, has a multiplicity of contact areas 7 of this type on each of the chips and has a corresponding number of connections to contact terminal areas 6 on the ceramic substrate 11 in the region of the interconnect level 19.

Figure 1B:
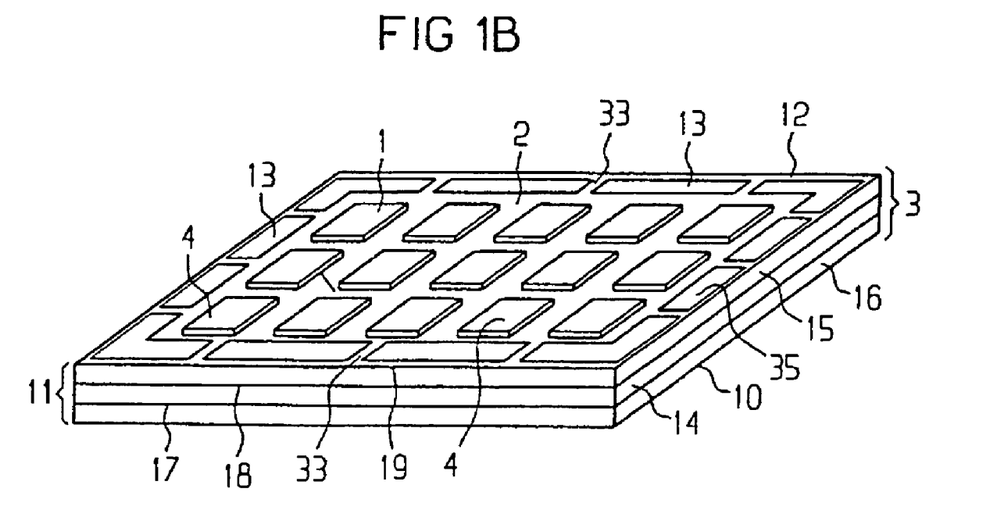

FIG. 1b shows an embodiment of the invention in which the stresses are not compensated by annularly closed metal coatings on the first side 2 and the second side 10 of the leadframe or ceramic substrate, but instead are distributed more favorably by an annularly arranged metal layer 13 provided with interruptions 33. The interruptions 33 are made so narrow such that when a plastic compound is injected between the injection mold 20, as revealed in FIGS. 2 and 3, and the ceramic leadframe 3, the plastic compound 24, as revealed in FIG. 4, solidifies within the interruption 33. The interruptions 33 may be arranged in such a way that the annularly arranged metal layer 13 comprises a multiplicity of metal strips 35 which are arranged directly in a row and aligned transversely in relation to the annular arrangement.

Since the ceramic substrates 11 are extremely sensitive to tensile stress and therefore an injection-molding technique with its high compressive loading in the edge regions 12 of the ceramic substrate 11 may rupture the ceramic substrate 11, the ductile annularly arranged metal layer 13 is provided in the inventive device for packaging electronic components using the injection-molding technique. An injection mold 20, as revealed in FIGS. 2 and 3, works itself into the metal layer 13, and consequently compensates for the unevennesses of the relatively rigid ceramic substrate. In the case of conventional ceramic substrates, unevennesses of this type lie in the range from 5 to 100 μm, so that a ductile annularly closed metal layer with a thickness of between 50 and 250 μm is entirely adequate to compensate for this unevennesses of a ceramic substrate which has, for example, a surface area of 40×40 mm². In the case of rectangular ceramic substrates, as revealed in FIG. 3, which may have, for example, passive component structures in different structured metal layers between ceramic layers, an annular groove 22 is additionally machined into the edge region of the ceramic substrate, specifically in the region of placement of the injection mold on the second side 10 of the leadframe 3 or the ceramic substrate 11. An annular groove of this type acts like a predetermined breaking point and forms relief cracks in the ceramic in the edge regions, so that no relief cracks occur in the direction of the ceramic areas carrying the components 1.

Figure 2:
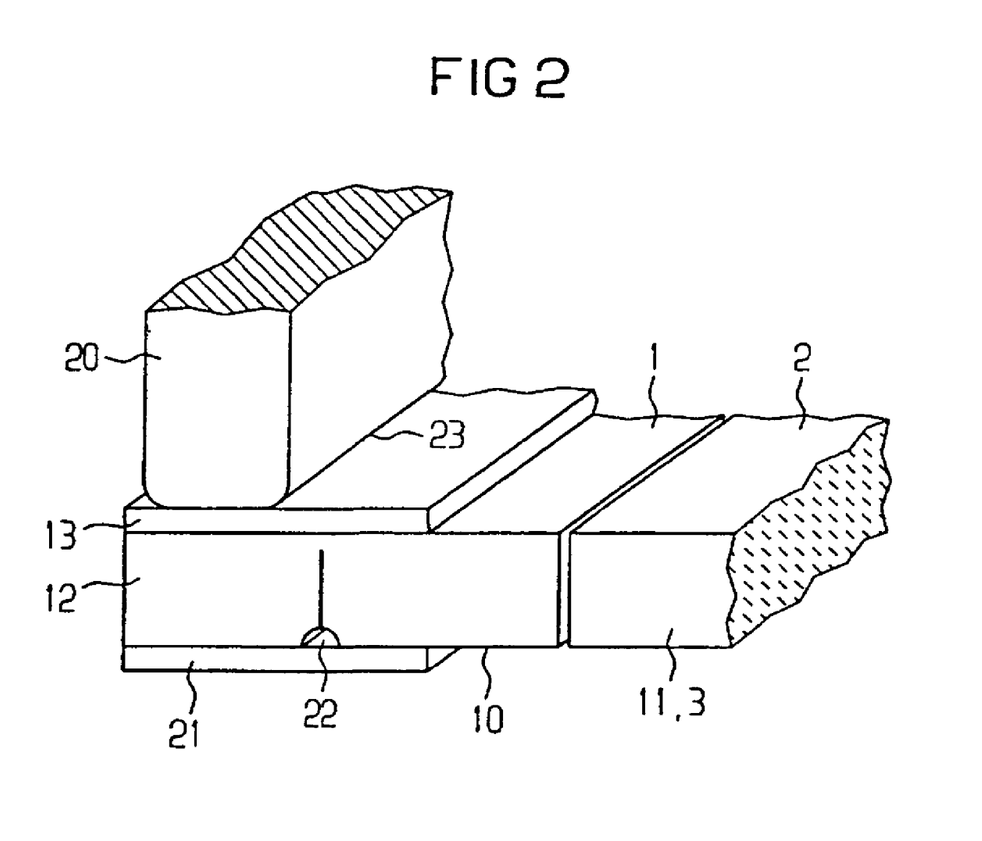
FIG. 2 shows a detail of a partial cross-sectional view of an embodiment of the device with an injection mold placed thereon.

FIG. 2 shows a detail of a partial cross sectional view of an inventive device with an injection mold 20 placed thereon. The dimension or thickness of the ceramic substrate 11 is greatly enlarged in the representation shown in FIG. 2. In this single-layered embodiment, the thicknesses of the ceramics lie between 100 and 600 µm and the thicknesses of the ductile metal layers 13 and 21 in the edge region 12 of the ceramic substrate 11 lie between 50 and 250 µm. In the case of multi-layered ceramic substrates, the thickness is a multiple of the single-layered embodiment corresponding to the number of layers, so that ceramics with inner passive components can reach a thickness of up to 1000 µm. The mold 20 can work itself into these ductile metal layers when it is pressed onto the substrate and consequently compensate for unevennesses, corrugations and other surface defects of the ceramic substrate 11. At the same time, FIG. 2 shows on an enlarged scale a relieving annular groove 22, which has been machined into the lower or second side 10 of the leadframe 3 or the ceramic substrate 11 in the edge region 12.

Figure 3:
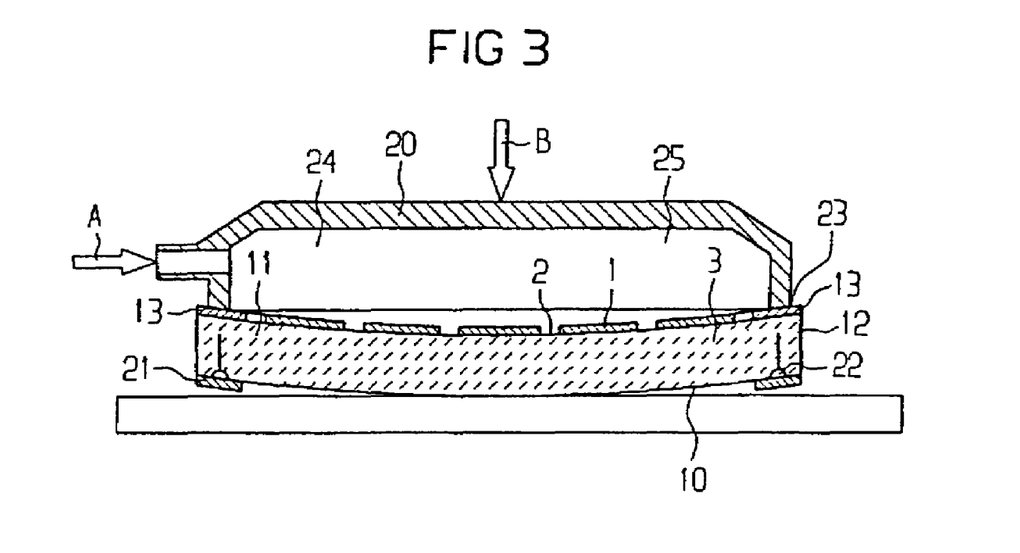
FIG. 3 shows a further embodiment of the device with an injection mold placed thereon.

FIG. 3 shows a further embodiment of the invention with an injection mold 20 placed thereon. On the first side 2, which carries the components 1, of the leadframe 3 or the ceramic substrate 11 there can be seen a cavity 25, which is filled with a plastic molding compound under a pressure of about 8 MPa in the direction of the arrow A. In order to keep the edge region of the device for packaging electronic components 1 sealed by using the injection-molding technique, the injection mold 20 is pressed in the direction of the arrow B onto the ductile annularly arranged metal layer 13 and the cavity 25 is consequently sealed, so that no plastic molding compound 24 can escape. The thickness ratios between the electronic components 1 and the ceramic substrate 11 are not shown true to scale in FIG. 3 for representational reasons. The electronic components 1 substantially comprise semiconductor chips of a thickness of between 100 and 500 µm, carrying integrated circuits, while the ceramic substrate 11 has a thickness of between 100 and 1000 µm. The bowing of the ceramic substrate 11 is also shown enlarged to illustrate the problem.

FIG. 4 shows using a saw blade 28 of width b to cut off the edge region 12, after the packaging of the electronic components 1 and shows the fusing on of solder balls 30 to form contact bumps 9 in the predetermined positions.

In this representation of FIG. 4, the injection mold has already been removed and the plastic molding compound 24 has cooled down and solidified, so that it forms a protective package for the electronic component 1. During the injection-molding operation, the plastic molding compound penetrates into all of the cavities and forms an insulating layer between conducting components. As FIG. 4 clearly shows, the integrated circuit (not shown) of a semiconductor chip of the electronic component 1 is connected for wiring purposes using the contact area 7 on the semiconductor chip, a bonding wire connection 27, a contact terminal area 6 on the ceramic substrate, and also an interconnect 2 on the first side of the ceramic substrate through a contact via 8 to the interconnect 6 on the second side 10 of the leadframe 3 or the ceramic substrate. A soldering contact area in the end region 31 of the interconnect 6 on the second side 10 of the ceramic substrate 11 receives a contact bump. This contact bump 9 is formed by fusing on a solder ball 30 on the soldering contact area 29. During the subsequent cutting up of the device for packaging electronic components using the injection-molding technique, individual components with external contact terminal areas or contact bumps 9 arranged in predetermined positions on the injection-molded package on the second side 10 of the ceramic substrate 11 are consequently obtained.

We claim:

1. A device for packaging electronic components including an injection-mold comprising:
   a plurality of components including a plurality of contact areas; and
   a leadframe formed as a ceramic substrate having a first side, a second side opposite said first side, interconnects, and contact terminal areas for connecting to said plurality of said contact areas of said plurality of said electronic components;
   said ceramic substrate formed with contact vias for providing external contact terminal areas or contact bumps on said second side;
   said first side of said ceramic substrate having edge regions configured with a ductile, annular metal layer for providing a seal with the injection mold; and
   said plurality of said components configured in predetermined positions on said first side of said ceramic substrate.

2. The device according to claim 1, wherein said annular metal layer forms a closed metal ring.

3. The device according to claim 1, wherein said annular metal layer has interruptions.

4. The device according to claim 1, wherein said contact bumps are produced from solder balls.

5. The device according to claim 1, wherein:
   said ceramic substrate includes a plurality of layers having different coefficients of thermal expansion;
   said plurality of said layers include a central inner ceramic layer and neighboring outer layers; and
   said central inner ceramic layer has a higher coefficient of thermal expansion than said neighboring outer layers.

6. The device according to claim 1, wherein:
   said ceramic substrate includes a plurality of layers having different moduli of elasticity;
   said plurality of said layers include a central inner ceramic layer and neighboring outer layers; and
   said central inner ceramic layer has a higher modulus of elasticity than said neighboring outer layers.

7. The device according to claim 1, wherein: said ceramic substrate is a multi-layered substrate, and said ceramic substrate includes a plurality of ceramic layers and a plurality of metal layers for reducing internal stresses.

8. The device according to claim 1, wherein:
   said ceramic substrate is a multi-layered substrate;
   said ceramic substrate includes a plurality of ceramic layers, a plurality of metal layers structured into said interconnects and into passive components; and
   said contact vias selectively connect together ones of said interconnects and ones of said components located at different ones of said plurality of said metal layers.

9. The device according to claim 1, wherein said ductile annular, metal layer is configured for placement against an injection mold defining a form of a package.

10. The device according to claim 1, wherein said second side of said ceramic substrate has edge regions provided with a ductile, annular metal layer.

11. The device according to claim 1, wherein said second side of said ceramic substrate has edge regions formed with an annular groove.

12. The device according to claim 11, wherein said groove is configured for placement against an injection mold.

13. The device according to claim 1, wherein said ceramic substrate is produced from fine-grained $Al_2O_3$ having a purity of greater than or equal to 96%.

14. The device according to claim 1, wherein said ceramic substrate is produced from fine-grained $Al_2O_3$ having a purity of greater than or equal to 96% and having added MgO.

15. The device according to claim 1, wherein said ceramic substrate is produced from fine-grained $Al_2O_3$ having a purity of greater than or equal to 96% and having incorporated $ZrO_2$ particles.

16. The device according to claim 1, wherein said ceramic substrate is produced from a material selected from a group Consisting of fine-grained steatite and forsterite.

17. The device according to claim 1, wherein said ceramic substrate is produced from fine-grained aluminum nitride.

18. The device according to claim 1, wherein said ceramic substrate consists of glass ceramic materials.

19. A method of packaging electronic components, which comprises:
   providing a ceramic substrate having interconnects, contact terminal areas and contact vias for providing external contact terminal areas or contact bumps at predetermined positions, the ceramic substrate having edge regions provided with a ductile, annular metal layer, the ceramic substrate having a first side carrying electronic components in a region bounded by the ductile, annular metal layer;
   providing an injection mold for forming a package;
   pressing the injection mold in a sealing manner onto the ductile, annular metal layer in the edge regions of the ceramic substrate;
   injecting a plastic molding compound into a cavity between the injection mold and the first side of the ceramic substrate;
   applying external contact terminal areas or contact bumps at predetermined positions on a second side of the ceramic substrate; and
   individually separating the electronic components to obtain plastic molded components.

20. The method according to claim 19, which comprises, while performing the step of individually separating the electronic components to obtain the plastic molded components, cutting off the edge regions of the ceramic substrate having the ductile, annular metal layer.

21. The method according to claim 19, which comprises producing the contact bumps by fusing on solder balls.

22. The method according to claim 19, which comprises:
   providing the ceramic substrate as a multi-layered substrate having a plurality of layers including a central inner ceramic layer and neighboring outer layers; and
   providing the central inner ceramic layer with a higher coefficient of thermal expansion than the neighboring outer layers.

23. The method according to claim 19, which comprises:
   providing the ceramic substrate as a multi-layered substrate having a plurality of layers including a central inner ceramic layer and neighboring outer layers; and
   providing the central inner ceramic layer with a higher modulus of elasticity than the neighboring outer layers.

24. The method according to claim 19, which comprises providing the ceramic substrate as a multi-layered substrate having a plurality of ceramic layers and a plurality of metal layers for reducing internal stresses.

25. The method according to claim 19, which comprises:
   producing the ceramic substrate as a multi-layered substrate with ceramic layers and with metal layers structured into interconnects and passive components; and
   using contact vias to selectively connect together ones of the interconnects and ones of the passive components located at different ones of the metal layers.

26. The method according to claim 19, which comprises forming the ductile, annular metal layer from a ductile copper alloy.

27. The method according to claim 26, which comprises using direct copper bonding to apply the copper alloy.

28. The method according to claim 19, which comprises forming the ductile, annular metal layer from a ductile aluminum alloy.

29. The method according to claim 19, which comprises forming the ductile, annular metal layer from a ductile iron/nickel alloy.

30. The method according to claim 19, which comprises using active soldering to apply the ductile metal layer.

31. The method according to claim 19, which comprises applying a ductile, annularly closed metal layer to edge regions on the second side of the ceramic substrate.

32. The method according to claim 19, which comprises machining an annularly closed groove into edge regions of the second side of the ceramic substrate.

33. The method according to claim 19, which comprises producing the ceramic substrate from fine-grained $Al_2O_3$ having a purity of greater than or equal to 96%.

34. The method according to claim 19, which comprises producing the ceramic substrate from fine-grained $Al_2O_3$ having a purity of greater than or equal to 96% and having added MgO.

35. The method according to claim 19, which comprises producing the ceramic substrate from fine-grained $Al_2O_3$ having a purity of greater than or equal to 96% and having incorporated $ZrO_2$ particles.

36. The method according to claim 19, which comprises producing the ceramic substrate from a material selected from a group consisting of fine-grained steatite and forsterite.

37. The method according to claim 19, which comprises producing the ceramic substrate fine-grained aluminum nitride.

38. The method according to claim 19, which comprises producing the ceramic substrate from glass ceramic materials.

* * * * *